(12) United States Patent
Summerfelt et al.

(10) Patent No.: US 9,035,458 B2
(45) Date of Patent: May 19, 2015

(54) LOW RESISTANCE STACKED ANNULAR CONTACT

(71) Applicant: Texas Instruments Incorporated, Dallas, TX (US)

(72) Inventors: Scott Robert Summerfelt, Garland, TX (US); Hasibur Rahman, Plano, TX (US); John Paul Campbell, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/158,948

(22) Filed: Jan. 20, 2014

(65) Prior Publication Data

US 2014/0131781 A1    May 15, 2014

Related U.S. Application Data

(62) Division of application No. 13/434,511, filed on Mar. 29, 2012, now Pat. No. 8,652,855.

(60) Provisional application No. 61/468,634, filed on Mar. 29, 2011.

(51) Int. Cl.
*H01L 21/00* (2006.01)
*H01L 21/8242* (2006.01)
*H01L 21/02* (2006.01)
(Continued)

(52) U.S. Cl.
CPC .......... *H01L 23/528* (2013.01); *H01L 23/5256* (2013.01); *H01L 21/76843* (2013.01); *H01L 23/5283* (2013.01); *H01L 23/485* (2013.01); *H01L 23/5226* (2013.01); *H01L 21/76838* (2013.01); *H01L 27/0629* (2013.01); *H01L 2924/0002* (2013.01)

(58) Field of Classification Search
CPC .............. H01L 23/528; H01L 53/5283; H01L 27/0629; H01L 23/5226; H01L 23/485; H01L 21/76838; H01L 23/5256; H01L 21/76843; H01L 2924/0002
USPC .......... 257/295, 306, 311, 774, 758, E21.664, 257/E27.104, E21.575, E21.649; 438/3, 438/637, 253, 250
See application file for complete search history.

(56) References Cited

U.S. PATENT DOCUMENTS 6,100,589 A * 8/2000 Tanaka .......................... 257/758
7,825,446 B2 * 11/2010 Takahashi et al. ............ 257/295
(Continued)

*Primary Examiner* — Fernando L Toledo
*Assistant Examiner* — Aaron Gray
(74) *Attorney, Agent, or Firm* — Jacqueline J. Garner; Frank Cimino

(57) ABSTRACT

An integrated circuit contains lower components in the substrate, a PMD layer, upper components over the PMD layer, lower contacts in the PMD layer connecting some upper components to some lower components, an ILD layer over the upper components, metal interconnect lines over the ILD layer, and upper contacts connecting some upper components to some metal interconnect lines, and also includes annular stacked contacts of lower annular contacts aligned with upper annular contacts. The lower contacts and upper contacts each have a metal liner and a contact metal on the liner. The lower annular contacts have at least one ring of liner metal and contact metal surrounding a pillar of PMD material, and the upper contacts have at least one ring of liner metal and contact metal surrounding a pillar of ILD material. The annular stacked contacts connect the metal interconnects to the lower components.

10 Claims, 13 Drawing Sheets

(51) Int. Cl.
*H01L 21/108* (2006.01)
*H01L 23/48* (2006.01)
*H01L 23/52* (2006.01)
*H01L 23/528* (2006.01)
*H01L 23/525* (2006.01)
*H01L 21/768* (2006.01)
*H01L 23/485* (2006.01)
*H01L 23/522* (2006.01)
*H01L 27/06* (2006.01)

(56) References Cited

U.S. PATENT DOCUMENTS

| | | | | |
|---|---|---|---|---|
| 7,969,008 B2* | 6/2011 | Nagai | ............................ | 257/758 |
| 2003/0124748 A1* | 7/2003 | Summerfelt et al. | ............. | 438/3 |
| 2005/0146041 A1* | 7/2005 | Watanabe et al. | ............. | 257/758 |
| 2011/0062550 A1* | 3/2011 | Udayakumar et al. | ........ | 257/532 |
| 2013/0319738 A1* | 12/2013 | Hurwitz et al. | ............... | 174/257 |

* cited by examiner

LOW RESISTANCE STACKED ANNULAR CONTACT

CROSS-REFERENCE TO RELATED APPLICATIONS

This application is a divisional of and claims priority to U.S. nonprovisional application Ser. No. 13/434,511, filed Mar. 29, 2012, which claims the benefit and priority of U.S. Provisional Application 61/468,634, filed Mar. 29, 2011, both of which are herein incorporated by reference in their entireties.

FIELD OF THE INVENTION

This invention relates to the field of integrated circuits. More particularly, this invention relates to contacts in integrated circuits.

BACKGROUND OF THE INVENTION

An integrated circuit may include a pre-metal dielectric (PMD) layer and an inter-level dielectric (ILD) layer between a semiconductor substrate and a first metal interconnect level. Upper components, such as ferroelectric capacitors, may be formed between the PMD layer and the ILD layer. Contacts between lower components in and on the substrate and the first metal interconnect level may be stacked contacts including a lower contact lower contact formed in the PMD layer and an upper contact formed in the ILD layer. The lower contact and the upper contact may be formed by depositing contact metal in contact holes and over top surfaces of the PMD layer and ILD layer, respectively, and subsequently removing the contact metal over the top surfaces of the PMD layer and ILD layer, leaving the lower contact and the upper contact, respectively. Such a process limits the width of the lower contact and the upper contact, so that forming a low resistance stacked contact may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed by forming lower components including transistors in and on a semiconductor substrate in active areas of field oxide at a top surface of the substrate. Other lower components such as resistors may be formed over the field oxide. Subsequently, a PMD layer is formed over the lower components and substrate. Lower contact holes are etched through the PMD layer, including conventional contact holes and annular contact holes. The annular contact holes are one or more closed-loop annular holes surrounding corresponding pillars of PMD layer material. A width of the annular holes in the annular contact holes is 0.75 to 2.5 times a width of the conventional contact holes. Some instances of the annular contact holes may have exactly one annular hole surrounding exactly one pillar of PMD material. Other instances of the annular contact holes may have a plurality of overlapping annular holes, each surrounding a corresponding pillar of PMD material. The pillar of PMD layer material has substantially equal length and width, being 1 to 4 times a width of the conventional contact holes. The layer of lower liner is formed in the lower contact holes and over a top surface of the PMD layer. The layer of lower contact metal is formed on the lower liner in the contact holes and over the top surface of the PMD layer. The lower contact metal and lower liner are subsequently removed from over the top surface of the PMD layer, for example by chemical mechanical polishing (CMP) or etchback processes, forming lower contacts in the lower contact holes. The lower contacts include conventional lower contacts in the conventional contact holes and annular lower contacts in the annular contact holes. A width of the annular metal in the annular lower contacts is 0.75 to 2.5 times a width of the conventional lower contacts. The pillar of PMD layer material surrounded by the annular metal is 1 to 4 times the width of the conventional lower contacts. Top surfaces of the conventional lower contacts and annular lower contacts are substantially coplanar with the top surface of the PMD layer.

Upper components such as ferroelectric capacitors or other memory components, resistors, capacitors, and/or thin film transistors are formed over the PMD layer. An ILD layer is formed over the upper components and the PMD layer. Upper contact holes are etched through the ILD layer, including conventional contact holes and annular contact holes, aligned with corresponding conventional lower contacts and annular lower contacts. A width of the annular holes in the annular contact holes is 0.75 to 2.5 times a width of the conventional contact holes. A pillar of ILD layer material surrounded by the annular holes in the annular contact holes has substantially equal length and width, being 1 to 4 times a width of the conventional contact holes. A layer of metal upper liner is formed is formed in the upper contact holes and over a top surface of the ILD layer, and a layer of upper contact metal is formed on the upper liner in the upper contact holes and over the top surface of the ILD layer. The upper contact metal and upper liner are subsequently removed from over the top surface of the ILD layer, forming upper contacts making electrical connections to the corresponding lower contacts. The upper contacts include conventional upper contacts in the conventional contact holes and annular upper contacts in the annular contact holes. A width of the annular metal in the annular upper contacts is 0.75 to 2.5 times a width of the conventional upper contacts. The pillar of ILD layer material surrounded by the annular metal is 1 to 4 times the width of the conventional upper contacts. Top surfaces of conventional upper contacts and annular upper contacts are substantially coplanar with the top surface of the ILD layer. A combination of an instance of the lower annular contacts electrically connected to a corresponding instance of the upper annular contacts forms a stacked annular contact. Similarly, a combination of an instance of the conventional lower contacts electrically connected to a corresponding instance of the conventional upper contacts forms a conventional stacked contact. A level of metal interconnects is formed over the ILD layer having metal interconnect lines which make electrical connections to the stacked annular contacts. The stacked annular contacts may advantageously provide lower resistance connections between the first interconnect level and the lower components in the substrate and on the field oxide than conventional stacked contacts in a same area as the annular stacked contact.

DETAILED DESCRIPTION OF EXAMPLE EMBODIMENTS

Figure 1:
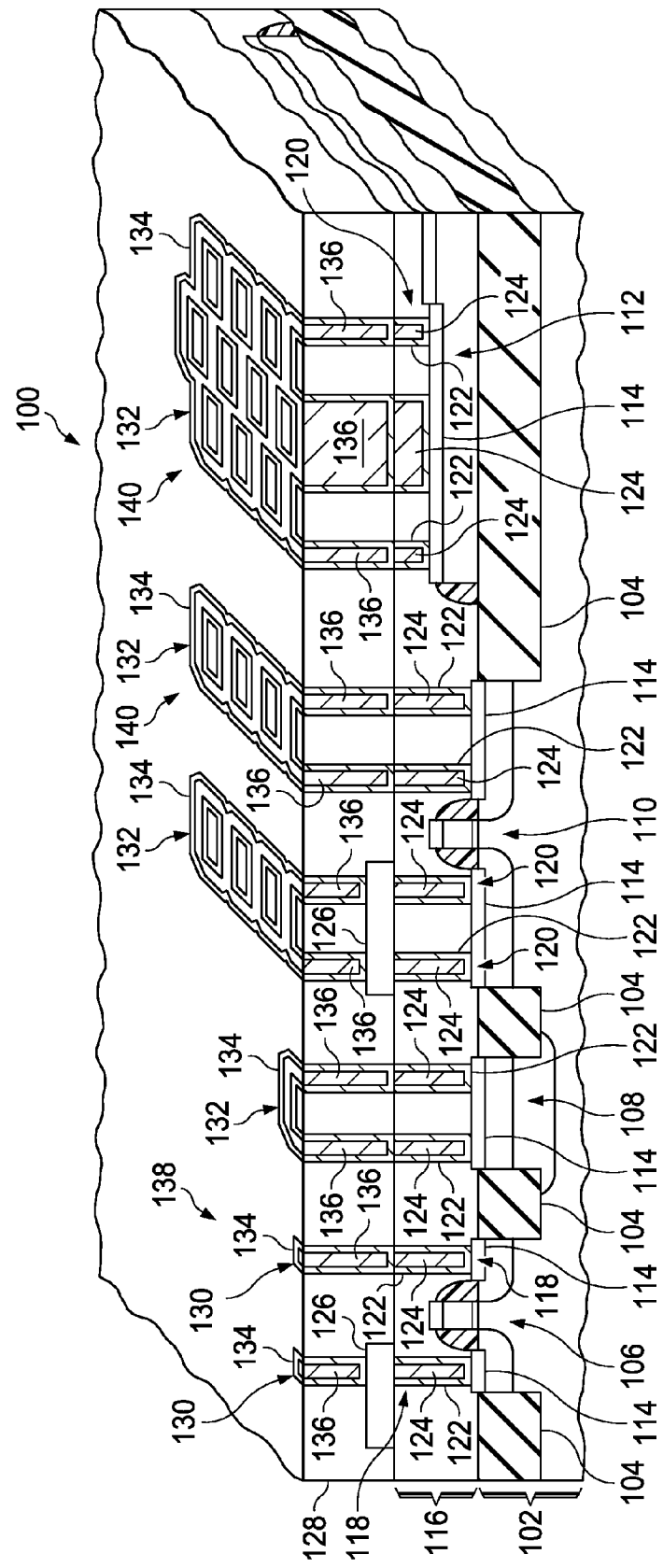
FIG. 1 is a cross section of an integrated circuit containing stacked annular contacts.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this description, the term "substantially" as applied to structures and elements formed in an integrated circuit is understood to mean within fabrication tolerances used to fabricate the integrated circuit.

An integrated circuit having a PMD layer and an ILD layer under a level of metal interconnect may be formed by a process including forming a layer of field oxide at a top surface of a semiconductor substrate of the integrated circuit, with active areas defined by openings in the field oxide. Lower components including transistors are formed in and on the substrate in the active areas and possibly over the field oxide. Subsequently, a PMD layer is formed over the lower components and substrate. Lower contact holes are etched through the PMD layer, including conventional contact holes and annular contact holes. The annular contact holes are one or more closed-loop annular holes surrounding corresponding pillars of PMD layer material. A width of the annular holes in the annular contact holes is 0.75 to 2.5 times a width of the conventional contact holes. Some instances of the annular contact holes may have exactly one annular hole surrounding exactly one pillar of PMD material. Other instances of the annular contact holes may have a plurality of overlapping annular holes, each surrounding a corresponding pillar of PMD material. The pillar of PMD layer material has substantially equal length and width, being 1 to 4 times a width of the conventional contact holes. The layer of lower liner is formed in the lower contact holes and over a top surface of the PMD layer. The layer of lower contact metal is formed on the lower liner in the contact holes and over the top surface of the PMD layer. The lower contact metal and lower liner are subsequently removed from over the top surface of the PMD layer, for example by chemical mechanical polishing (CMP) or etchback processes, forming lower contacts in the lower contact holes. The lower contacts include conventional lower contacts in the conventional contact holes and annular lower contacts in the annular contact holes. A width of the annular metal in the annular lower contacts is 0.75 to 2.5 times a width of the conventional lower contacts. The pillar of PMD layer material surrounded by the annular metal is 1 to 4 times the width of the conventional lower contacts. Top surfaces of the conventional lower contacts and annular lower contacts are substantially coplanar with the top surface of the PMD layer.

Upper components such as ferroelectric capacitors or other memory components, resistors, capacitors, and/or thin film transistors are formed over the PMD layer. An ILD layer is formed over the upper components and the PMD layer. Upper contact holes are etched through the ILD layer, including conventional contact holes and annular contact holes, aligned with corresponding conventional lower contacts and annular lower contacts. A width of the annular holes in the annular contact holes is 0.75 to 2.5 times a width of the conventional contact holes. A pillar of ILD layer material surrounded by the annular holes in the annular contact holes has substantially equal length and width, being 1 to 4 times a width of the conventional contact holes. A layer of metal upper liner is formed is formed in the upper contact holes and over a top surface of the ILD layer, and a layer of upper contact metal is formed on the upper liner in the upper contact holes and over the top surface of the ILD layer. The upper contact metal and upper liner are subsequently removed from over the top surface of the ILD layer, forming upper contacts making electrical connections to the corresponding lower contacts. A width of the annular metal in the annular upper contacts is 0.75 to 2.5 times a width of the conventional upper contacts. The pillar of ILD layer material surrounded by the annular metal is 1 to 4 times the width of the conventional upper contacts. Top surfaces of conventional upper contacts and annular upper contacts are substantially coplanar with the top surface of the ILD layer. A combination of an instance of the lower annular contacts electrically connected to a corresponding instance of the upper annular contacts forms a stacked annular contact. Similarly, a combination of an instance of the conventional lower contacts electrically connected to a corresponding instance of the conventional upper contacts forms a conventional stacked contact. A level of metal interconnects is formed over the ILD layer having metal interconnect lines which make electrical connections to the stacked annular contacts. The stacked annular contacts may advantageously provide lower resistance connections between the first interconnect level and the lower components in the substrate and on the field oxide than conventional stacked contacts in a same area as the annular stacked contact. In a particular example, a stacked annular contact may advantageously provide a lower resistance connection to an electrical fuse. In another particular example, a stacked annular contact may advantageously provide a lower resistance connection to source/drain region of an MOS transistor. Widths of the PMD material pillars and the ILD material pillars are desirably formed as small as possible, consistent with providing mechanical and chemical integrity for etch masks for the upper and lower contact holes.

Widths of features such as contact holes, dielectric pillars, conventional contacts and annular rings of metal in annular contacts may be measured at a convenient reference point, for example at a top surface of the relevant feature.

FIG. 1 is a cross section of an integrated circuit containing stacked annular contacts. The integrated circuit 100 is formed in and on a semiconductor substrate 102. Field oxide 104 is formed at a top surface of the substrate 102, having active areas defined by openings in the field oxide 104. Lower components are formed in and on the substrate 102 and possibly over the field oxide 104, for example, a metal oxide semiconductor (MOS) transistor 106, a diode 108, a high current MOS transistor 110 and a polysilicon resistor 112 on the field oxide 104. A layer of metal silicide 114 may be formed on the lower components 106, 108, 110 and 112 to provide low resistance connections.

A PMD layer 116 is formed over the lower components 106, 108, 110 and 112 and over the field oxide 104 and substrate 102. The PMD layer 116 may be, for example, a dielectric layer stack including a PMD liner 10 to 100 nanometers thick, a PMD main layer 200 to 5000 nanometers thick, and an optional PMD cap layer 10 to 100 nanometers.

Lower contacts, including conventional lower contacts 118 and annular lower contacts 120, are formed in the PMD layer 116 making electrical connection to the lower components 106, 108, 110 and 112 and extending substantially to a top surface of the PMD layer 116. The conventional lower contacts 118 and annular lower contacts 120 include a metal lower liner 122 on lateral and lower surfaces of the lower contacts 118 and 120, and a lower contact metal 124 disposed on the lower liner 122. Top surfaces of the lower liner 122 and lower contact metal 124 are substantially coplanar with the top surface of the PMD layer 116. Each annular lower contact 120 is configured in at least one closed-loop annular ring of the lower liner 122 and lower contact metal 124 surrounding a corresponding pillar of dielectric material of the PMD layer 116. A width of the annular ring of the lower liner 122 and lower contact metal 124 is 0.75 to 2.5 times a width of the conventional lower contacts 118. The pillar of PMD layer material has substantially equal length and width, being 1 to 4 times a width of the conventional lower contacts 118.

Upper components 126 are formed over the PMD layer 116. At least a portion of the upper components 126 are disposed over a portion of the lower contacts and make electrical connection to top surfaces of instances of the conventional lower contacts 118 and/or the annular lower contacts 120. The upper components 126 may include, for example, memory components such as ferroelectric capacitors, resistor memory elements, sometimes referred to as memristors, or phase-change elements. The upper components 126 may include resistors, capacitors and/or thin-film transistors of circuits in the integrated circuit 100. Other upper components are within the scope of the instant invention.

An ILD layer 128 is formed over the upper components 126 and the PMD layer 116. The ILD layer 128 may include, for example, an etch stop layer 5 to 25 nanometers thick, a main layer of 100 to 200 nanometers of silicon dioxide or low-k dielectric material, and a cap layer 10 to 40 nanometers thick.

Upper contacts, including conventional upper contacts 130 and annular upper contacts 132 are formed in the ILD layer 128. The conventional upper contacts 130 and annular upper contacts 132 include a metal upper liner 134 on lateral and lower surfaces of the upper contacts 130 and 132, and an upper contact metal 136 disposed on the upper liner 134. Top surfaces of the upper liner 134 and upper contact metal 136 are substantially coplanar with a top surface of the ILD layer 128. Each annular upper contact 132 is configured in at least one closed-loop annular ring of the upper liner 134 and upper contact metal 136 surrounding a corresponding pillar of dielectric material of the ILD layer 128. A width of the conventional upper contacts 130 is 75 percent to 125 percent of the width of the conventional lower contacts 118. A width of the annular ring of the upper liner 134 and upper contact metal 136 is 0.75 to 2.5 times the width of the conventional upper contacts 130. The pillar of ILD layer material has substantially equal length and width, being 1 to 4 times a width of the conventional upper contacts 130.

A portion of the conventional upper contacts 130 are aligned with, and make electrical connection to, corresponding instances of the conventional lower contacts 118. A portion of the annular upper contacts 132 are aligned with, and make electrical connection to, corresponding instances of the annular lower contacts 120. A portion of the upper contacts are disposed over, and make electrical connection to, at least a portion of the upper components 126. A level of metal interconnects is subsequently formed over the ILD layer 128, described hereinbelow in reference to FIG. 2J, so that metal interconnect lines of the first interconnect level make electrical connections to the conventional upper contacts 130 and annular upper contacts 132.

A combination of a conventional lower contact 118 electrically connected to a corresponding conventional upper contact 130 forms a conventional stacked contact 138. The conventional stacked contact 138 electrically connects a metal interconnect line of the first interconnect level to a lower component 106, 108, 110 or 112 in or on the substrate 102 or the field oxide 104. An aspect ratio of the conventional upper contact 130 in the conventional stacked contact 138 is defined as ratio of a height of the conventional upper contact 130 to a lateral width of the conventional upper contact 130. The aspect ratio of the conventional upper contact 130 in the conventional stacked contact 138 may be at least three. Similarly, an aspect ration of the conventional lower contact 118 in the conventional stacked contact 138 may be at least three.

A combination of an annular lower contact 120 electrically connected to a corresponding annular upper contact 132 forms an annular stacked contact 140. The annular stacked contact 140 electrically connects a metal interconnect line of the first interconnect level to a lower component 106, 108, 110 or 112 in or on the substrate 102 or the field oxide 104.

Figure 2A:
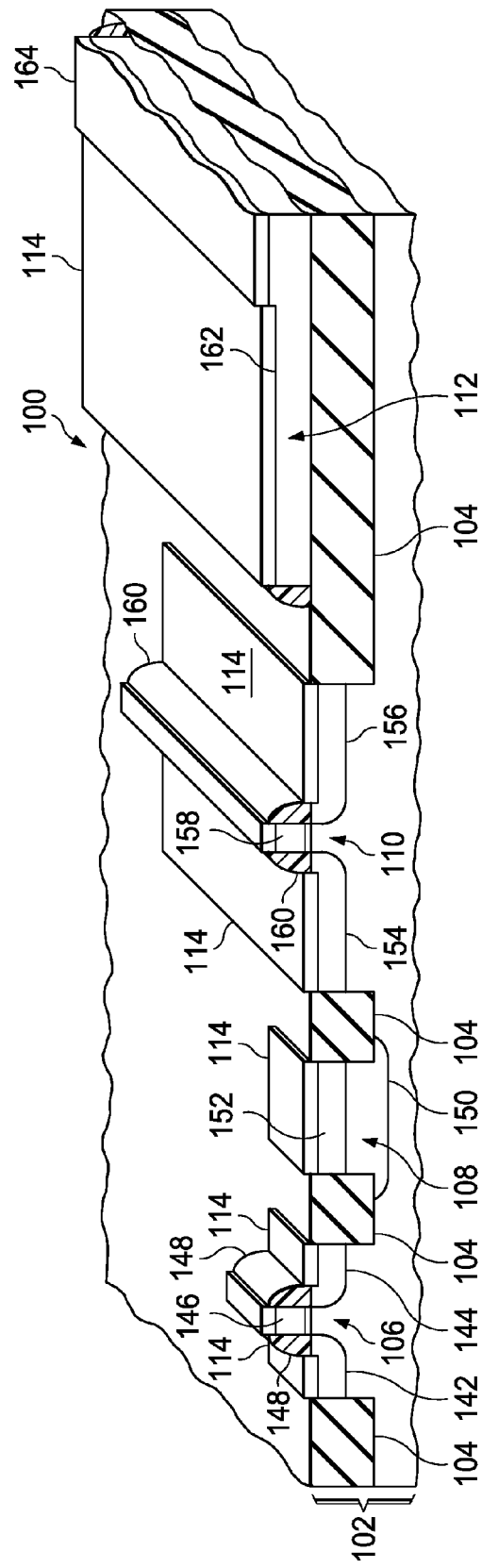
FIG. 2A through FIG. 2J are cross sections of the integrated circuit of FIG. 1, depicted in successive stages of fabrication.

FIG. 2A through FIG. 2J are cross sections of the integrated circuit of FIG. 1, depicted in successive stages of fabrication. Referring to FIG. 2A, the integrated circuit 100 is formed in and on the semiconductor substrate 102, which may be, for example, a single crystal silicon wafer, a silicon-on-insulator (SOI) wafer, a hybrid orientation technology (HOT) wafer with regions of different crystal orientations, or other material appropriate for fabrication of the integrated circuit 100. The field oxide 104 is formed at the top surface of the substrate 102. Active areas are defined by openings in the field oxide 104 which expose the substrate 102. The field oxide 104 may be, for example, silicon dioxide between 250 and 600 nanometers thick, possibly with a silicon nitride liner. The field oxide 104 may be formed, for example, by shallow trench isolation (STI) processes.

Lower components are formed in and on the substrate 102 and possibly over the field oxide 104. The lower components may include, for example, the MOS transistor 106, having a source region 142 and a drain region 144 in the substrate 102 on opposite sides of a gate 146 flanked by sidewall spacers 148. The lower components may also include, for example, the diode 108, which includes an n-type cathode region 150 in the substrate 102 and a p-type anode region 152 at the top surface of the substrate 102. The lower components may further include, for example, the high current MOS transistor 110, having a high current source region 154 and a high current drain region 156 in the substrate 102 on opposite sides of a wide gate 158 flanked by sidewall spacers 160. The lower components may also include, for example, the polysilicon resistor 112, including a polysilicon body 162 and a layer of silicide block dielectric material 164 over the polysilicon body 162. The layer of metal silicide 114 may be formed on the lower components 106, 108, 110 and 112 to reduce electrical resistance.

Figure 2B:
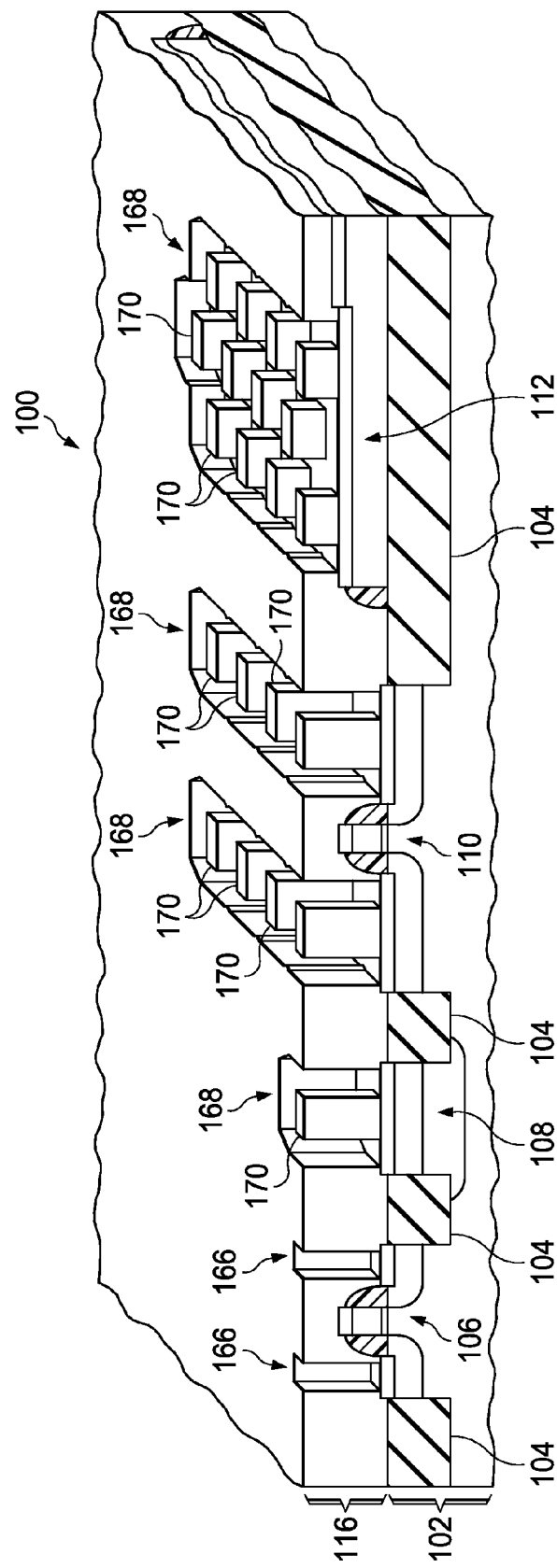

Referring to FIG. 2B, the PMD layer 116 is formed over the lower components 106, 108, 110 and 112 and the substrate 102 and field oxide 104. The PMD ;layer 116 may be, as described in reference to FIG. 1, a dielectric layer stack including a PMD liner, a PMD main layer, and an optional PMD cap layer. The PMD liner may be silicon nitride or silicon dioxide, 10 to 100 nanometers thick, formed by PECVD. The PMD main layer may be a layer of silicon dioxide formed by a high aspect ratio process (HARP) followed by a layer of silicon dioxide, phospho-silicate glass (PSG) or boro-phospho-silicate glass (BPSG), commonly 300 to 1000 nanometers thick, deposited by a PECVD on a top surface of the PMD liner, and sometimes leveled by a CMP process. The optional PMD cap layer is commonly 10 to 100 nanometers of a hard material such as silicon nitride, silicon carbide nitride, silicon dioxide or silicon carbide, formed on a top surface of the PMD main layer. The PMD layer 116 may possibly further include a top layer which enhances performance and/or reliability of the upper components 126, such as a hydrogen barrier containing aluminum oxide.

Lower contact holes are etched through the PMD layer 116, including conventional lower contact holes 166 and annular lower contact holes 168. The lower contact holes may be etched using a reactive ion etch (RIE) process. The conventional lower contact holes 166 may have a round or rounded square shape at a top surface of the PMD layer 116, or may be rectangular, sometimes referred to as stretch contacts. The annular lower contact holes 168 are one or more closed-loop annular holes surrounding corresponding pillars 170 of PMD layer material. Some instances of the annular lower contact holes 168 may have a single annular hole surrounding a single pillar 170 of PMD material. Other instances of the annular lower contact holes 168 may have a plurality of overlapping annular holes configured in a linear array, each surrounding a corresponding pillar 170 of PMD material. Further instances of the annular lower contact holes 168 may have a plurality of overlapping annular holes configured in a two-dimensional array, each surrounding a corresponding pillar 170 of PMD material. A width of the annular holes is 0.75 to 2.5 times a width of the conventional lower contact holes 166. The pillar 170 of PMD layer material has substantially equal length and width, being 1 to 4 times the width of the conventional lower contact holes 166.

Figure 2C:
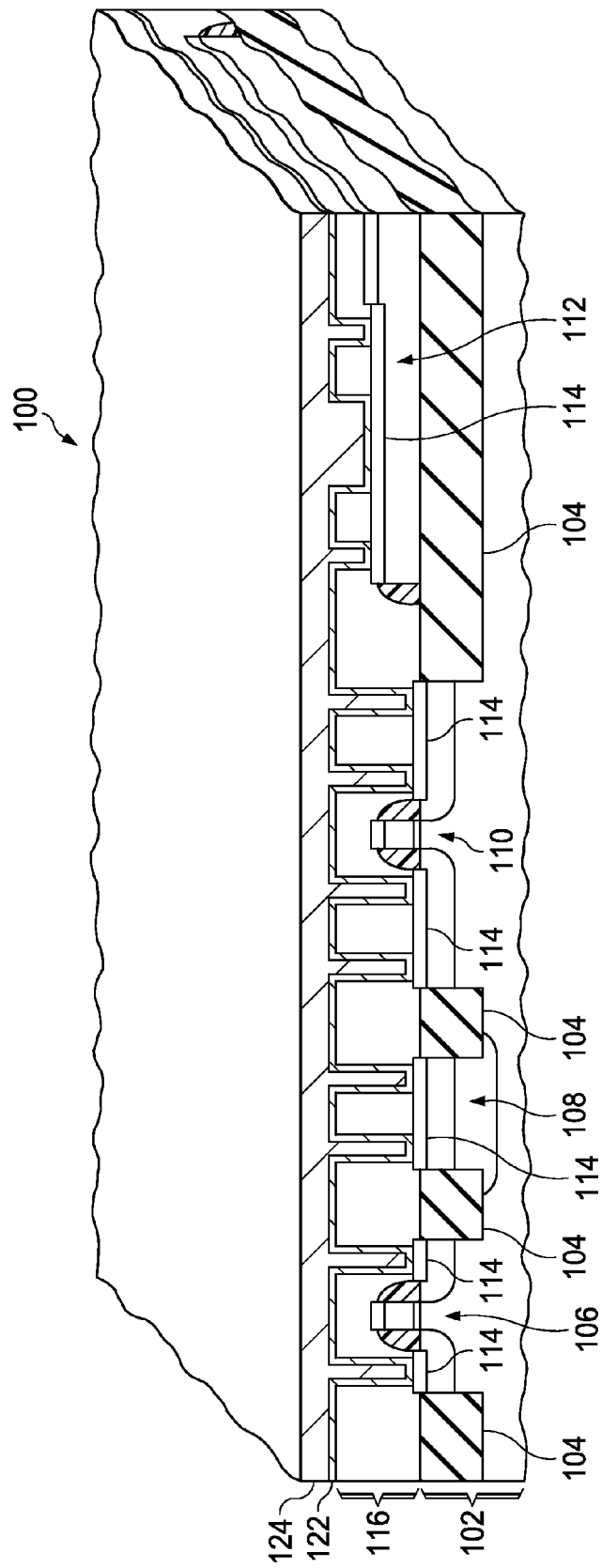

Referring to FIG. 2C, the layer of metal lower liner 122 is formed over the PMD layer 116 and in the conventional lower contact holes 166 and the annular lower contact holes 168. For conventional lower contact holes 166 and annular lower contact holes 168 having widths of 150 to 200 nanometers, the lower liner 122 may be formed, for example, by forming a layer of titanium 20 to 40 nanometers thick, heating the integrated circuit 100 in a rapid thermal processor (RTP) tool at 725° C. for 30 seconds or equivalent anneal conditions, for example, 740° C. for 15 seconds, or 710° C. for 60 seconds, and subsequently forming a layer of titanium nitride 5 to 20 nanometers thick on the titanium layer. The lower liner 122 makes electrical connection to the lower components 106, 108, 110, and 112, through the metal silicide 114 if present.

The layer of lower contact metal 124 is formed on the layer of metal lower liner 122, extending into the conventional lower contact holes 166 and the annular lower contact holes 168. The lower contact metal 124 may be, for example, tungsten 200 to 300 nanometers thick formed by a chemical vapor deposition (CVD) process in which hydrogen and silane reduce WF6 gas to form tungsten metal. The combined thickness of the layer of metal lower liner 122 and the layer of lower contact metal 124 is related to the width of the conventional lower contact holes 166 and the width of the annular holes of the annular lower contact holes 168 such that a top surface of the lower contact metal 124 is above the top surface of the PMD layer 116, so as to reduce dimples in the subsequently formed lower contacts. It will be recognized that the thicknesses of the layer of metal lower liner 122 and the layer of lower contact metal 124 may be reduced from the examples recited herein to accommodate conventional lower contact holes 166 and annular lower contact holes 168 with smaller widths.

Figure 2D:
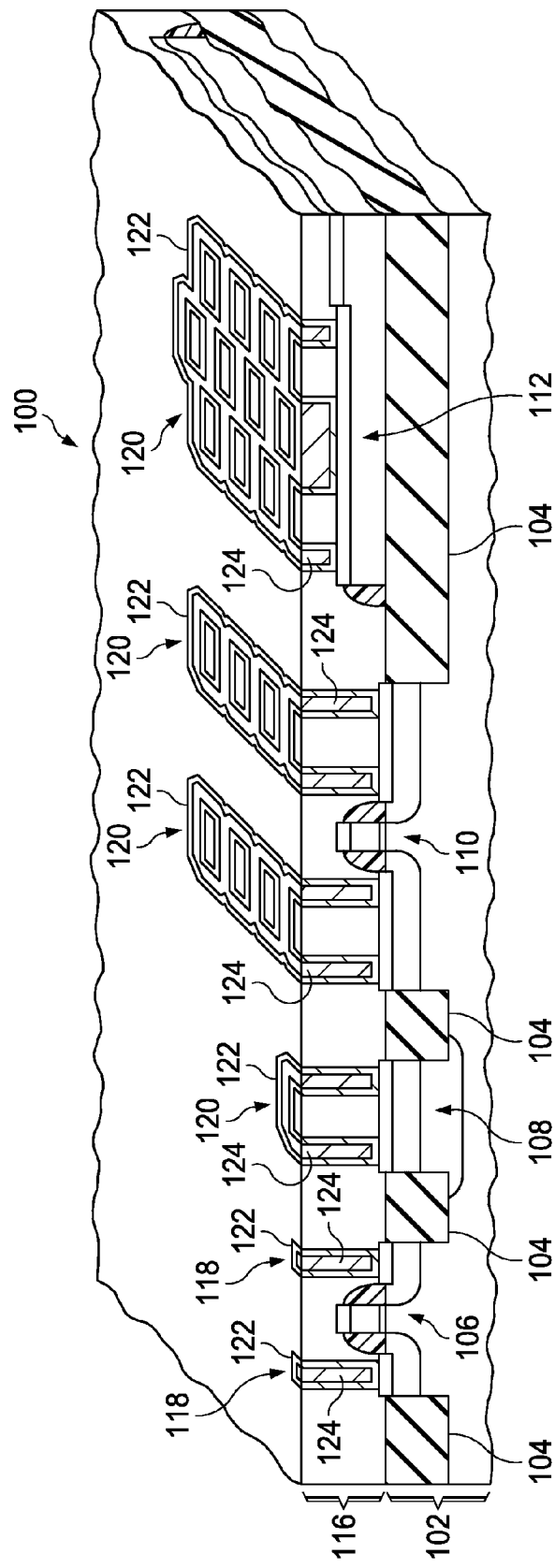

Referring to FIG. 2D, the metal lower liner 122 and the lower contact metal 124 are removed from the top surface of the PMD layer 116, for example by a CMP process or an etchback process, to form the conventional lower contacts 118 and the annular lower contacts 120. The removal is performed so that the top surfaces of the conventional lower contacts 118 and the annular lower contacts 120 are substantially coplanar with the top surface of the PMD layer 116.

Figure 2E:
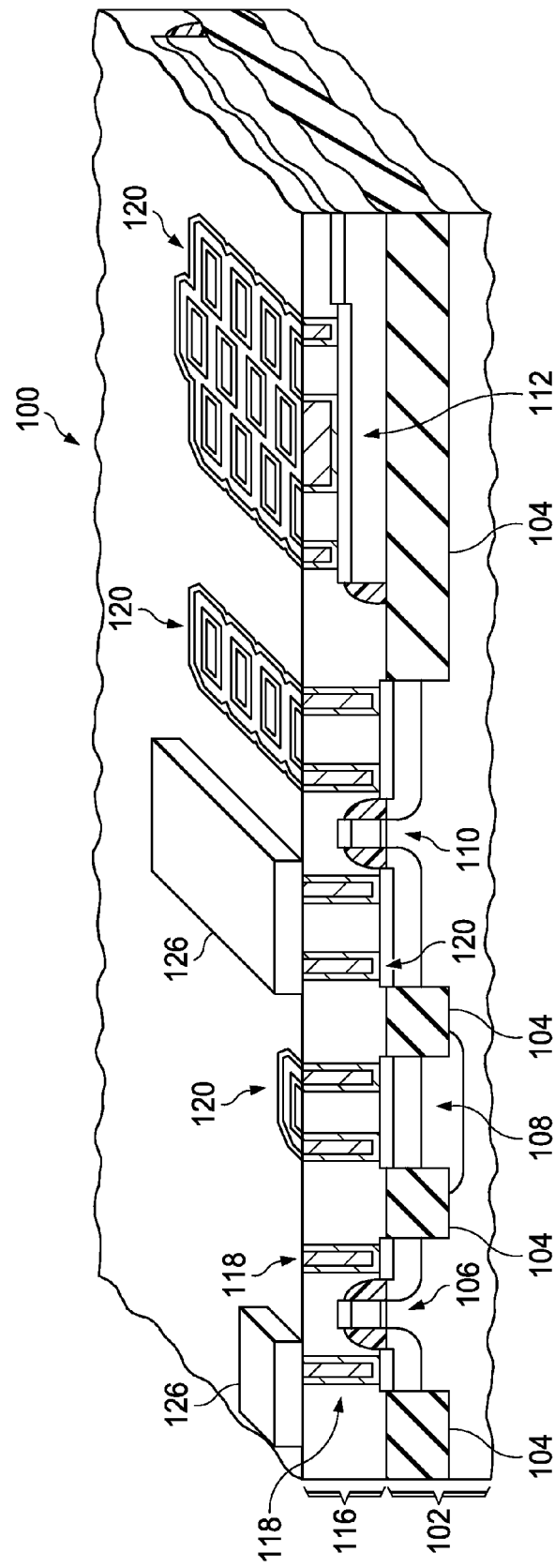

Referring to FIG. 2E, the upper components 126 are formed over the PMD layer 116, possibly making electrical contact with instances of the conventional lower contacts 118 and the annular lower contacts 120. The upper components 126 may be formed, for example, by forming one or more layers of component material such as a stack of a lower electrode layer, a ferroelectric capacitor dielectric layer and an upper electrode layer, followed by forming an etch mask over the stack and subsequently performing an RIE process to removed unwanted material from the stack outside the etch mask.

Figure 2F:
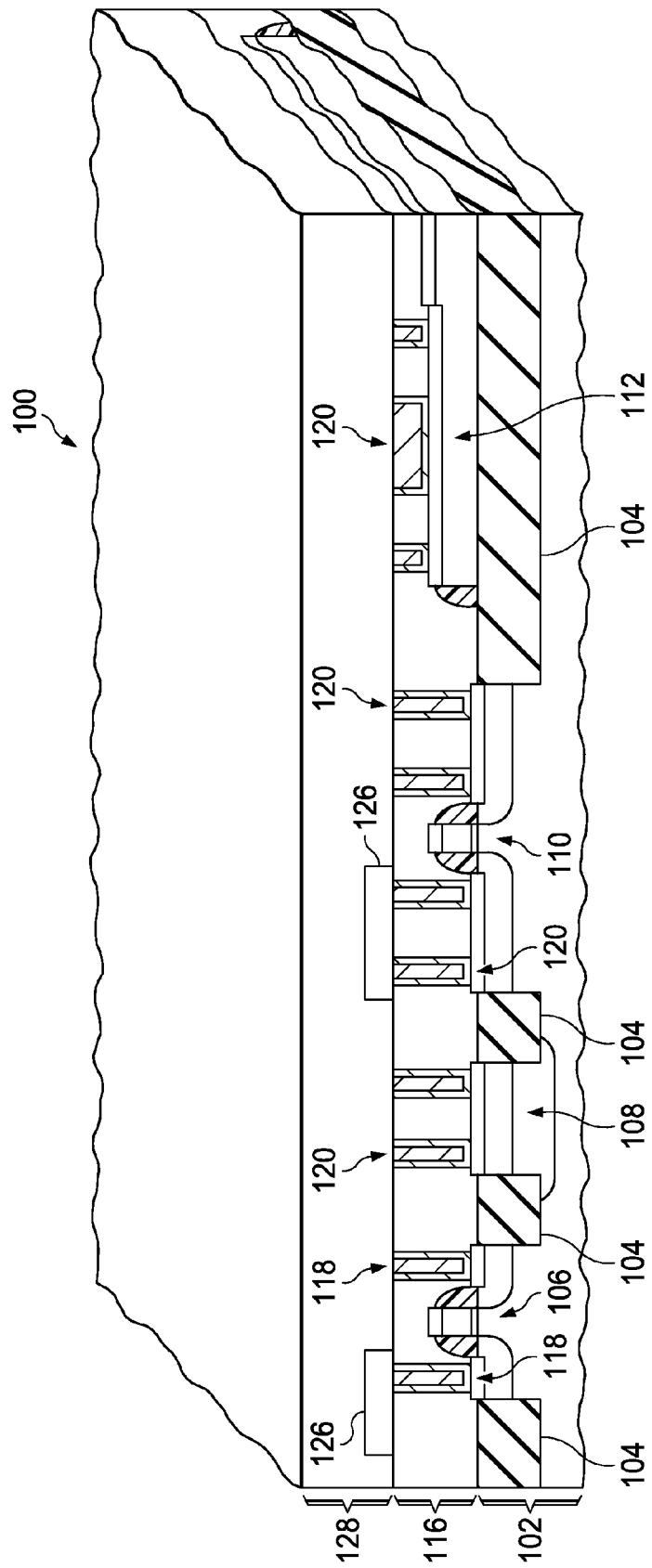

Referring to FIG. 2F, the ILD layer 128 is formed over the upper components 126 and the PMD layer 116. The ILD layer 128 may include a lower layer which enhances performance and/or reliability of the upper components 126, such as a hydrogen barrier. The ILD layer 128 may include, for example, an etch stop layer of 5 to 25 nanometers of silicon nitride, silicon carbide, or silicon carbide nitride, a main layer of 400 to 1000 nanometers of silicon dioxide or low-k dielectric material such as organo-silicate glass (OSG), carbon-doped silicon oxides (SiCO or CDO) or dielectric material formed from methylsilsesquioxane (MSQ), or possibly ultra low-k dielectric material such as porous OSG (p-OSG). The main layer may be leveled by a CMP operation. The ILD layer 128 may also include a cap layer of 10 to 40 nanometers of silicon nitride, silicon carbide nitride or silicon carbide. The ILD layer 128 may be formed by a combination of CVD, sputtering, plasma enhanced chemical vapor deposition (PECVD), low pressure chemical vapor deposition (LPCVD), atmospheric pressure chemical vapor deposition (APCVD), high density plasma (HDP), HARP, and/or other suitable dielectric layer formation process.

Figure 2G:
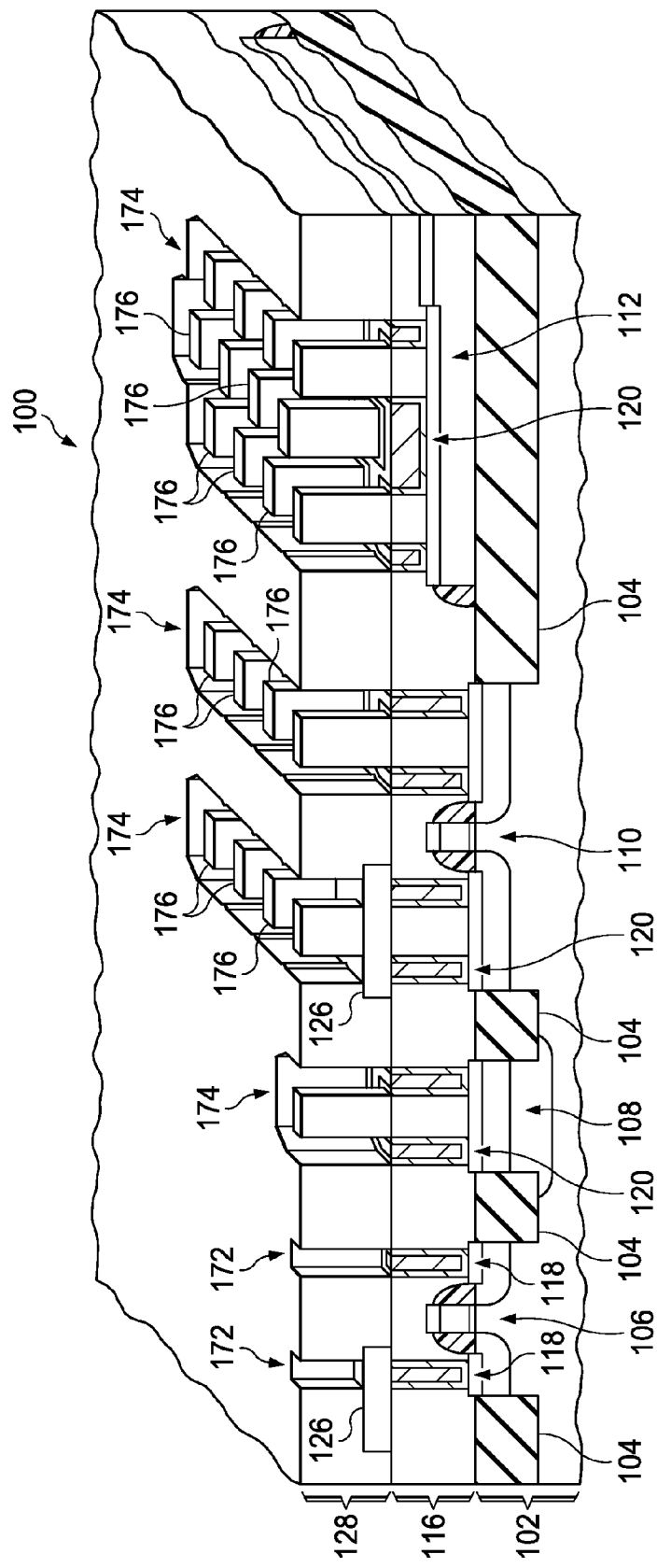

Referring to FIG. 2G, upper contact holes are etched through the ILD layer 128, including conventional upper contact holes 172 and annular upper contact holes 174. The upper contact holes may be etched using an RIE process. Some instances of the conventional upper contact holes 172 are aligned with, and expose, corresponding conventional lower contacts 118. The annular upper contact holes 174 are one or more closed-loop annular holes surrounding corresponding pillars 176 of dielectric material of the ILD layer 128. Some instances of the annular upper contact holes 174 are aligned with, and expose, corresponding annular lower contacts 120. A width of the annular holes is 0.75 to 2.5 times a width of the conventional upper contact holes 172. The pillar 176 of ILD layer material has substantially equal length and width, being 1 to 4 times the width of the conventional upper contact holes 172.

Figure 2H:
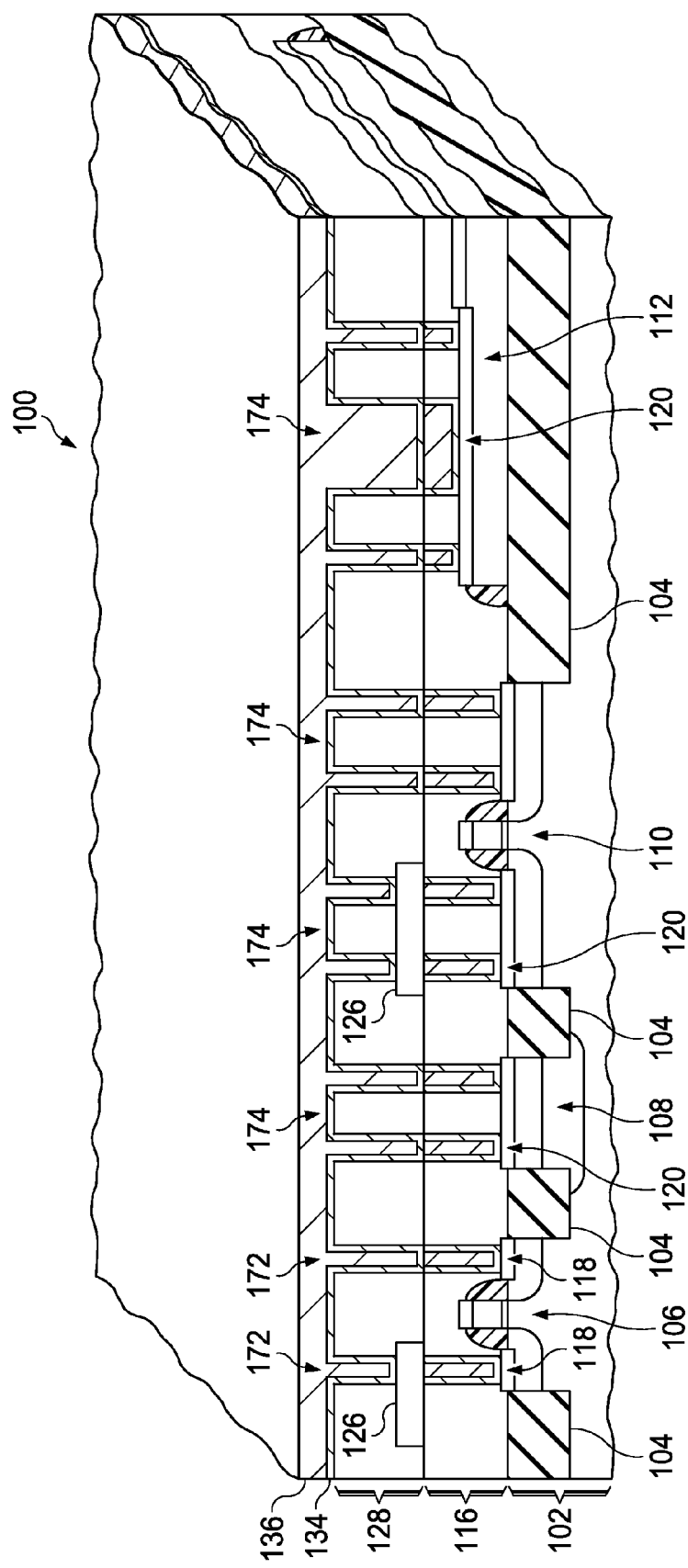

Referring to FIG. 2H, the layer of metal upper liner 134 is formed over the ILD layer 128 and in the conventional upper contact holes 172 and the annular upper contact holes 174.

The upper liner 134 may be formed in a similar manner as the layer of metal lower liner 122. The lower liner 122 makes electrical connection to the lower contacts 118 and 120. The layer of upper contact metal 136 is formed on the layer of metal upper liner 134, extending into the conventional upper contact holes 172 and the annular upper contact holes 174. The upper contact metal 136 may be formed in a similar manner as the layer of lower contact metal 124. The combined thickness of the layer of metal upper liner 134 and the layer of upper contact metal 136 is related to the width of the conventional upper contact holes 172 and the width of the annular holes of the annular upper contact holes 174 such that a top surface of the upper contact metal 136 is above the top surface of the ILD layer 128, so as to reduce dimples in the subsequently formed upper contacts. It will be recognized that the thicknesses of the layer of metal upper liner 134 and the layer of upper contact metal 136 may be reduced from the examples recited herein to accommodate conventional upper contact holes 172 and annular upper contact holes 174 with smaller widths.

Figure 2I:
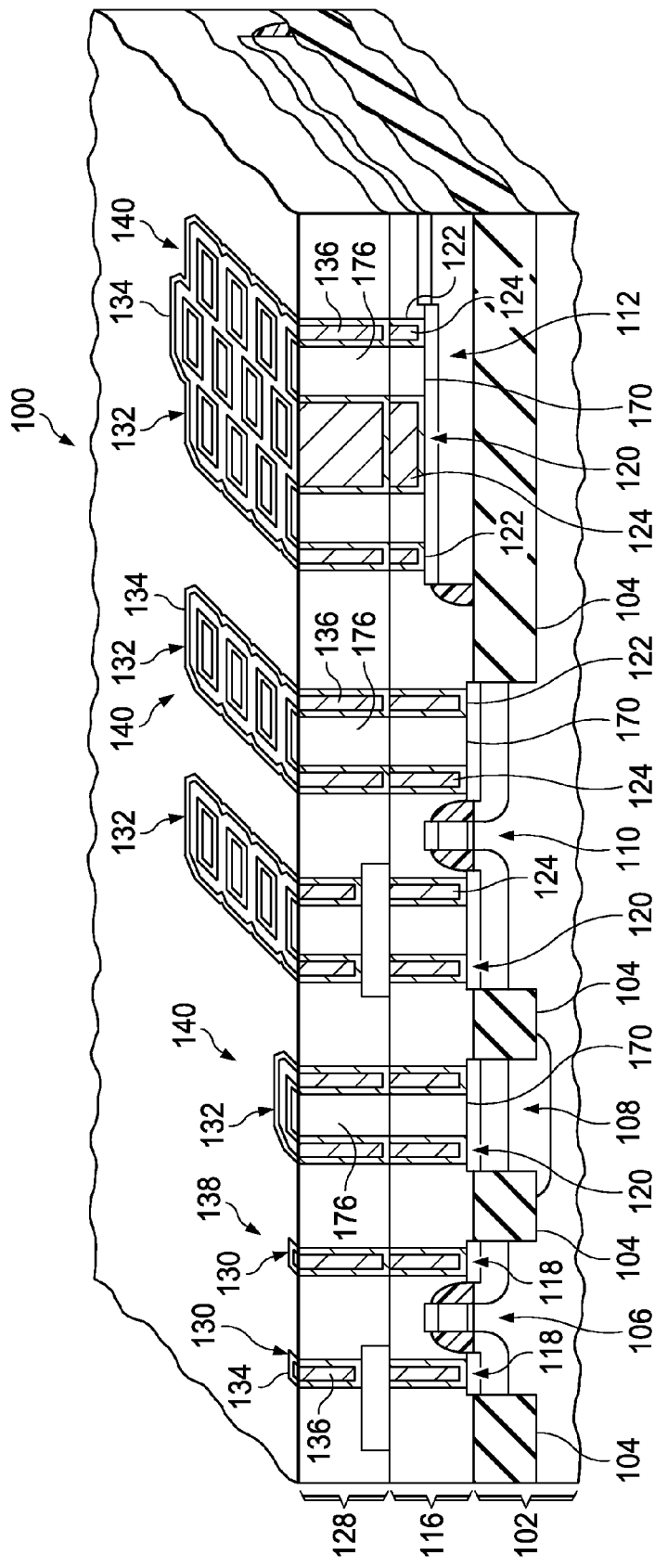

Referring to FIG. 2I, the metal upper liner 134 and the upper contact metal 136 are removed from the top surface of the ILD layer 128, to form the conventional upper contacts 130 and the annular upper contacts 132. The metal upper liner 134 and the upper contact metal 136 may be removed using a similar process as used to remove the metal lower liner 122 and the lower contact metal 124 from the top surface of the PMD layer 116. The removal is performed so that the top surfaces of the conventional upper contacts 130 and the annular upper contacts 132 are substantially coplanar with the top surface of the ILD layer 128. The combination of a conventional lower contact 118 electrically connected to a corresponding conventional upper contact 130 forms a conventional stacked contact 138. The combination of an annular lower contact 120 electrically connected to a corresponding annular upper contact 132 forms an annular stacked contact 140.

Some instances of the annular stacked contacts 140 may have an annular lower contact 120 with a single closed-loop annular ring of the metal lower liner 122 and the lower contact metal 124 surrounding a single pillar 170 of PMD material, and a corresponding single annular upper contact 132 with a single closed-loop annular ring of the metal upper liner 134 and the upper contact metal 136 surrounding a corresponding single pillar 176 of ILD material. Other instances of the annular stacked contacts 140 may have an annular lower contact 120 with a linear array of overlapping closed-loop annular rings of the metal lower liner 122 and the lower contact metal 124 surrounding a linear array of corresponding pillars 170 of PMD material, and a corresponding single annular upper contact 132 with a linear array of overlapping closed-loop annular rings of the metal upper liner 134 and the upper contact metal 136 surrounding a linear array of corresponding pillars 176 of ILD material. Instances of the annular stacked contacts 140 having such a linear configuration may be particularly advantageous for providing low resistance electrical connections to source/drain regions of MOS transistors, such as the high current MOS transistor 110. Further instances of the annular stacked contacts 140 may have an annular lower contact 120 with a two-dimensional array of overlapping closed-loop annular rings of the metal lower liner 122 and the lower contact metal 124 surrounding a two-dimensional array of corresponding pillars 170 of PMD material, and a corresponding single annular upper contact 132 with a two-dimensional array of overlapping closed-loop annular rings of the metal upper liner 134 and the upper contact metal 136 surrounding a two-dimensional array of corresponding pillars 176 of ILD material. The widths of the annular rings of metal in the annular stacked contacts 140 having single closed-loop annular rings may be wider than the widths of the annular rings of metal in the annular stacked contacts 140 having with a two-dimensional array of overlapping closed-loop annular rings. The widths of the annular rings of metal in the annular stacked contacts 140 having with a linear configuration or a two-dimensional array of overlapping closed-loop annular rings may vary around the corresponding dielectric pillars.

Figure 2J:
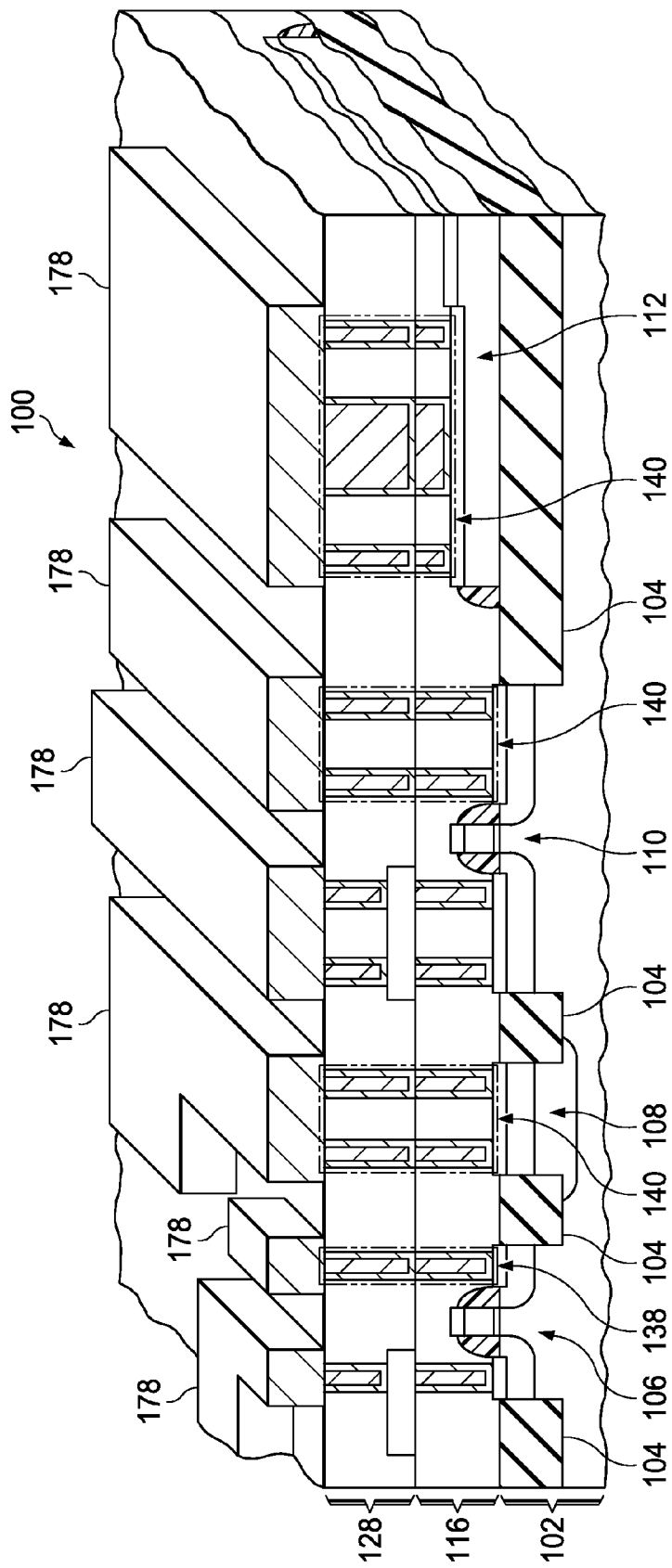

Referring to FIG. 2J, a level of metal interconnects is formed over the ILD layer 128 having metal interconnect lines 178 which make electrical connections to the top surfaces of the conventional stacked contacts 138 and the stacked annular contacts 140. Each annular stacked contact 140 electrically connects a metal interconnect line 178 of the first interconnect level to a lower component 106, 108, 110 or 112 in or on the substrate 102 or the field oxide 104. The metal interconnect lines 178 may be formed, for example using a copper damascene process by etching trenches in a second ILD layer formed over the ILD layer 128, forming a layer of liner metal such as tantalum nitride in the trenches, forming a seed layer of sputtered copper on the liner metal, electroplating copper on the seed layer to fill the trenches, and subsequently removing the copper and liner metal from a top surface of the second ILD layer by CMP and etch processes, leaving the metal interconnect lines 178. In another example, the metal interconnect lines 178 may be formed by forming a layer of interconnect metal including a titanium-containing adhesion layer, an aluminum layer and a titanium nitride cap layer on the ILD layer 128 making electrical contact to the conventional stacked contacts 138 and the stacked annular contacts 140, forming an etch mask on the layer of interconnect metal, and removing unwanted interconnect metal outside the etch mask, leaving the metal interconnect lines 178.

Figure 3:
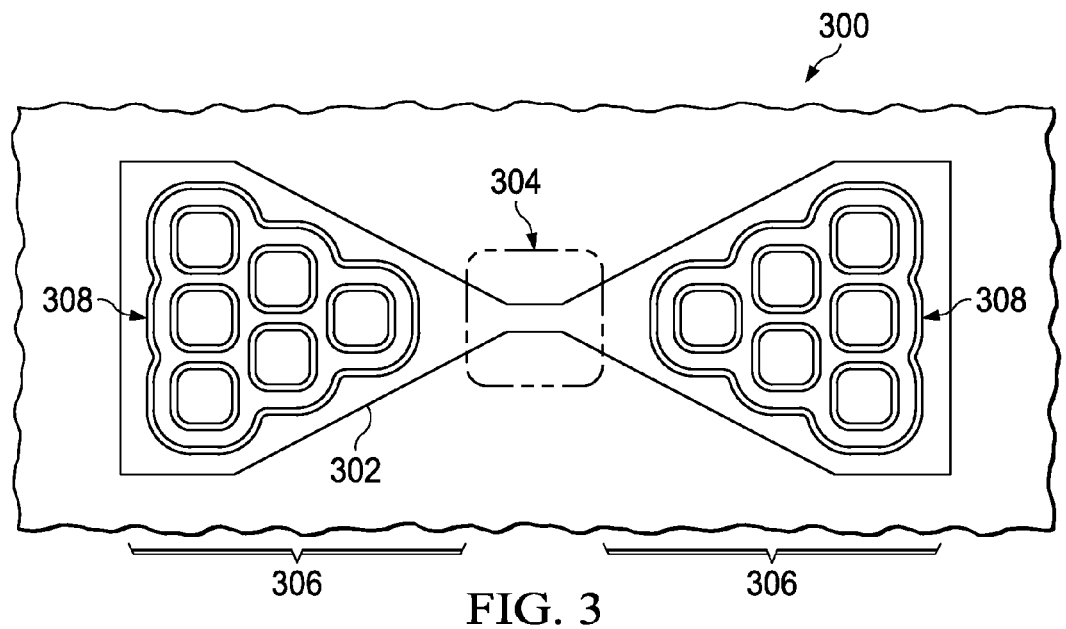
FIG. 3 is a top view of an integrated circuit containing an electrical fuse with annular stacked contacts.

FIG. 3 is a top view of an integrated circuit containing an electrical fuse with annular stacked contacts. The integrated circuit 300 has an electrical fuse 302 with a fuse body section 304 of electrically conductive material and at least one contact section 306 of electrically conductive material adjacent to the fuse body section 304. The fuse body section 304 may be, for example, polysilicon with a layer of metal silicide on the polysilicon. Reliability of the electrical fuse 302 may be enhanced by configuring the fuse body section 304 to have a minimum width significantly smaller than widths of conventional stacked contacts in the integrated circuit 300. For example, an instance of the integrated circuit fabricated using design rules and processes appropriate to the 130 nanometer complementary MOS (CMOS) node, the widths of the conventional stacked contacts in the integrated circuit 300 may be 150 to 200 nanometers, and the minimum width of the fuse body section 304 may be less than 120 nanometers. Reliability of the electrical fuse 302 may be further enhanced by configuring each contact section 306 to have a triangular shape which narrows to match the width of the fuse body section 304. A triangular shaped stacked annular contact 308 is formed on each contact section 306 so as to provide electrical contact proximate to the fuse body section 304. Metal interconnect lines are formed to make electrical connection to top surfaces of the triangular shaped stacked annular contacts 308 as described in reference to FIG. 2J. Forming the electrical fuse 302 with the triangular shaped stacked annular contact 308 on each contact section 306 may advantageously reduce an electrical resistance between the metal interconnect lines through the electrical fuse 302, thereby desirably enhancing reliability of the electrical fuse 302.

Figure 4A:
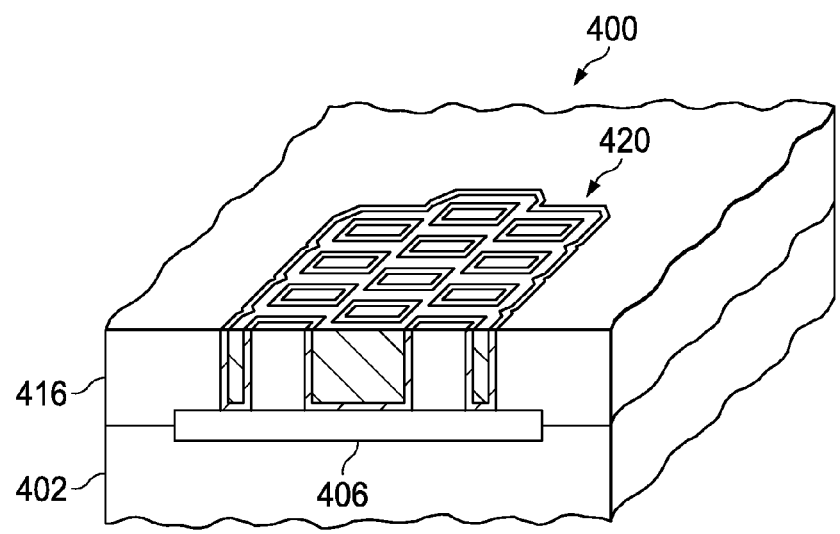
FIG. 4A through FIG. 4C are cross sections of an integrated circuit containing a tapered stacked annular contact.
Figure 4B:
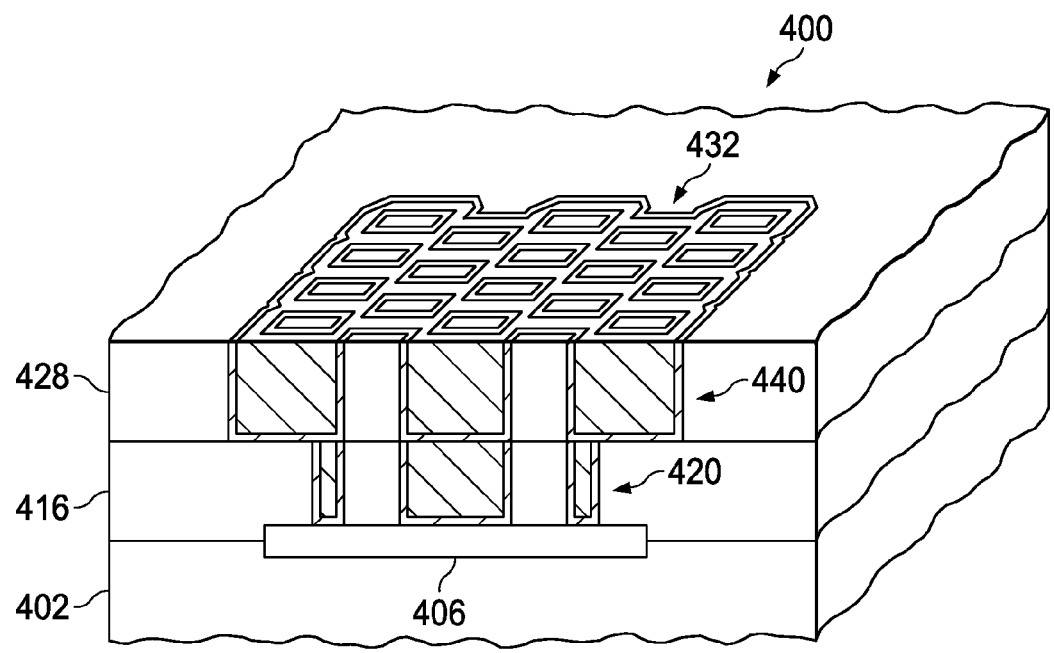
Figure 4C:
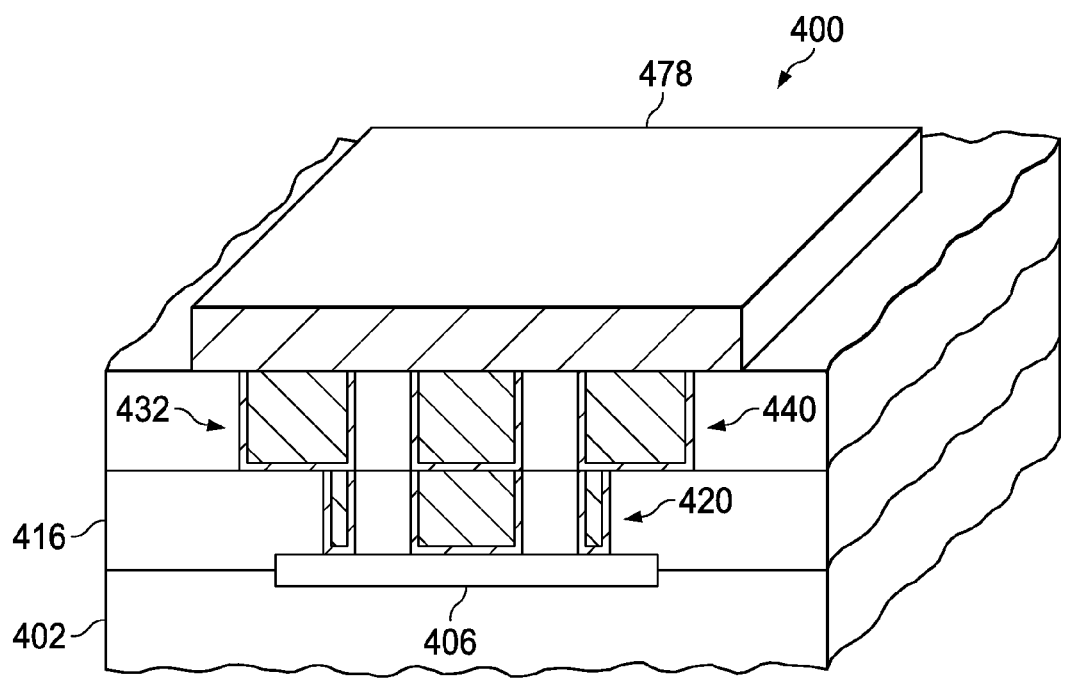

FIG. 4A through FIG. 4C are cross sections of an integrated circuit containing a tapered stacked annular contact. Referring to FIG. 4A, the integrated circuit 400 is formed in and on a semiconductor substrate 402 as discussed in reference to FIG. 2A. A lower component 406 is formed in or on the substrate 402 or over field oxide, as discussed in reference to FIG. 2A. A PMD layer 416 is formed over the substrate 402 and the lower component 406 as discussed in reference to FIG. 2B. An annular lower contact 420 is formed in the PMD layer 416 making electrical connection to the lower component 406 as described in reference to FIG. 2B through FIG. 2D. Upper components are subsequently formed over the PMD layer 416 as discussed in reference to FIG. 2E.

Referring to FIG. 4B, an ILD layer 428 is formed over the PMD layer 416 and the annular lower contact 420 as described in reference to FIG. 2F. An annular upper contact 432 is formed in the ILD layer 428 as described in reference to FIG. 2G through FIG. 2I, making electrical connection to the annular lower contact 420. The annular upper contact 432 includes closed-loop annular rings of metal surrounding pillars of dielectric material of the ILD layer 428 which extend past the annular lower contact 420 on at least two opposite sides of the annular lower contact 420. A combination of the annular lower contact 420 electrically connected to the wider annular upper contact 432 forms a tapered annular stacked contact 440

Referring to FIG. 4C, a level of metal interconnects is formed over the ILD layer 428 having a metal interconnect line 478 which makes electrical connection to a top surface of the tapered annular stacked contact 440. Forming the tapered annular stacked contact 440 with the annular upper contact 432 to be wider than the annular lower contact 420 may advantageously reduce an electrical resistance between the metal interconnect line 478 and the lower component 406.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a semiconductor substrate;
a plurality of lower components disposed in and on said substrate, said lower components including transistors;
a pre-metal dielectric (PMD) layer disposed over said lower components and said substrate;
lower contacts disposed in said PMD layer, making electrical connections to said lower components and extending to a top surface of said PMD layer, said lower contacts having a metal lower liner on lateral and lower surfaces of said lower contacts and a lower contact metal disposed on said lower liner, said lower contacts including:
conventional lower contacts; and
annular lower contacts, such that each said annular lower contact is configured in at least one closed-loop annular ring of said lower liner and said lower contact metal, said annular ring surrounding a corresponding pillar of dielectric material of said PMD layer, such that said PMD material pillar has substantially equal length and width, being 1 to 4 times a width of said conventional lower contacts, and a width of said annular ring is 0.75 to 2.5 times said width of said conventional lower contacts;
upper components disposed over said PMD layer, wherein at least a portion of said upper components are disposed over, and make electrical connection to top surfaces of, instances of a portion of said lower contacts;
an inter-level dielectric (ILD) layer disposed over said upper components and said PMD layer;
upper contacts disposed in said ILD layer, aligned with, and making electrical connections to, said upper contacts and extending to a top surface of said ILD layer, said upper contacts having a metal upper liner on lateral and lower surfaces of said upper contacts and an upper contact metal disposed on said upper liner, said upper contacts including:
conventional upper contacts, of which a portion are aligned with, and make electrical connection to, corresponding instances of said conventional lower contacts, such that a width of said conventional upper contacts is 75 percent to 125 percent of said width of said conventional lower contacts; and
annular upper contacts, such that each said annular upper contact is configured in at least one closed-loop annular ring of said upper liner and said upper contact metal, said annular ring surrounding a corresponding pillar of dielectric material of said ILD layer, such that said ILD material pillar has substantially equal length and width, being 1 to 4 times a width of said conventional upper contacts, and a width of said annular ring is 0.75 to 2.5 times said width of said conventional upper contacts; and
a level of metal interconnects disposed over said ILD layer, said metal interconnects having metal interconnect lines which make electrical connections to top surfaces of said conventional stacked contacts and said stacked annular contacts;
such that said integrated circuit includes a plurality of annular stacked contacts, an instance of said annular stacked contacts being a combination of an instance of said annular lower contacts electrically connected to a corresponding instance of said annular upper contacts, in which said instance of said annular lower contacts makes electrical connection to an instance of said lower components and said instance of said annular upper contacts makes electrical connection to an instance of said metal interconnect.

2. The integrated circuit of claim 1, in which an instance of said annular stacked contacts has:
an annular lower contact having a single closed-loop annular ring of said lower liner and said lower contact metal; and
a corresponding annular upper contact having a single closed-loop annular ring of said upper liner and said upper contact metal, aligned with said single closed-loop annular ring of said annular lower contact.

3. The integrated circuit of claim 1, in which an instance of said annular stacked contacts has:
an annular lower contact having a linear array of overlapping closed-loop annular rings of said lower liner and said lower contact metal; and
a corresponding annular upper contact having a linear array of overlapping closed-loop annular ring of said upper liner and said upper contact metal, aligned with said linear array of closed-loop annular ring of said annular lower contact.

4. The integrated circuit of claim 1, in which an instance of said annular stacked contacts has:
- an annular lower contact having a two-dimensional array of overlapping closed-loop annular rings of said lower liner and said lower contact metal; and
- a corresponding annular upper contact having a two-dimensional array of overlapping closed-loop annular ring of said upper liner and said upper contact metal, aligned with said two-dimensional array of closed-loop annular ring of said annular lower contact.

5. The integrated circuit of claim 1, in which an instance of said annular stacked contacts is a tapered annular stacked contact, including:
- an annular lower contact having at least one closed-loop annular ring of said lower liner and said lower contact metal; and
- an annular upper contact having a plurality of overlapping closed-loop annular ring of said upper liner and said upper contact metal, including closed-loop annular rings surrounding pillars of dielectric material of said ILD layer which extend past said annular lower contact of said tapered annular stacked contact on at least two opposite sides of said annular lower contact.

6. The integrated circuit of claim 1, including:
an electrical fuse, having:
- a fuse body section of electrically conductive material with a width less than said width of said conventional lower contacts; and
- at least one contact section of electrically conductive material adjacent to said fuse body section, said contact section having a triangular shape which narrows to match said width of said fuse body section; and
- a triangular shaped stacked annular contact disposed on said contact section so as to provide electrical contact proximate to said fuse body section.

7. The integrated circuit of claim 1, in which an instance of said lower components is a metal oxide semiconductor (MOS) transistor, and an instance of said stacked annular contacts is disposed on a source/drain region of said MOS transistor.

8. The integrated circuit of claim 1, in which:
- said lower liner includes a first layer of titanium and a layer of titanium nitride disposed on said first layer of titanium; and
- said upper liner includes a second layer of titanium and a layer of titanium nitride disposed on said second layer of titanium.

9. The integrated circuit of claim 1, in which:
- said lower contact metal includes tungsten disposed on said lower liner; and
- said upper contact metal includes tungsten disposed on said upper liner.

10. The integrated circuit of claim 1, in which said upper components include a plurality of ferroelectric capacitors.

* * * * *